United States Patent
Deng et al.

(10) Patent No.: US 10,923,308 B1
(45) Date of Patent: Feb. 16, 2021

(54) METHOD AND SYSTEM FOR ENERGY RESOLVED CHROMA IMAGING

(71) Applicant: FEI Company, Hillsboro, OR (US)

(72) Inventors: Yuchen Deng, Eindhoven (NL); Peter Christiaan Tiemeijer, Eindhoven (NL); Holger Kohr, Eindhoven (NL); Jaydeep Sanjay Belapure, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/677,164

(22) Filed: Nov. 7, 2019

(51) Int. Cl.
*H01J 37/05* (2006.01)
*H01J 37/26* (2006.01)
*H01J 37/244* (2006.01)

(52) U.S. Cl.
CPC ............ *H01J 37/05* (2013.01); *H01J 37/244* (2013.01); *H01J 37/26* (2013.01); *H01J 2237/057* (2013.01); *H01J 2237/226* (2013.01); *H01J 2237/24475* (2013.01); *H01J 2237/24485* (2013.01)

(58) Field of Classification Search
CPC .......... H01J 37/05; H01J 37/26; H01J 37/244; H01J 2237/226; H01J 2237/24475; H01J 2237/057; H01J 2237/24485

USPC ................................. 250/305–307, 310, 311
See application file for complete search history.

(56) References Cited

U.S. PATENT DOCUMENTS

| 8,334,512 | B2 | 12/2012 | Luecken et al. | |
| 8,859,966 | B2 | 10/2014 | Tiemeijer et al. | |
| 2016/0086762 | A1* | 3/2016 | de Jong | H01J 37/285 250/305 |

OTHER PUBLICATIONS

James Hart et al; Direct Detection Electron Energy-Loss Spectroscopy: A Method to Push the Limits of Resolution and Sensitivity; Scientific Reports; Aug. 15, 2017; pp. 1-14; Nature.com.

* cited by examiner

*Primary Examiner* — Michael Maskell

(57) ABSTRACT

Various methods and systems are provided for generating an energy resolved chroma image of a sample. Upon irradiated by a charged particle beam, scattered charged particles from the sample are directed to form a first image before entering a spectrometer. The scattered charged particles are then dispersed based on their energy when passing through the spectrometer. The dispersed particles form a second image on a detector. The scattered particles at each location of the first image is spread along a corresponding energy spread vector in the second image.

19 Claims, 6 Drawing Sheets

US 10,923,308 B1

METHOD AND SYSTEM FOR ENERGY RESOLVED CHROMA IMAGING

FIELD OF THE INVENTION

The present description relates generally to methods and systems for imaging a sample with a charged particle beam, and more particularly, to generate an energy resolved chroma image of the sample.

BACKGROUND OF THE INVENTION

Spatial and compositional information of a sample may be extracted from scattered electrons that are interacted with the sample. Arrangement of atoms (or more precisely, the distribution of spatial frequencies) of the sample may be identified based on the scattering angles of the elastically scattered electrons. The distribution of these scattering angles (which are sometimes called diffraction angles) can be observed in the back-focal plane of the first imaging lens where they form the so-called diffraction pattern. Composition of the sample may be identified based on the energy loss of the inelastically scattered electrons, as can be observed, for example, in an energy-loss spectrum. However, no imaging modality can capture, and at the same time differentiate, the elastically and inelastically scattered electrons. For example, electron diffraction imaging preserves the spatial information but loses the compositional information. Electron energy loss spectroscopy preserves the compositional information but loses the spatial information. Energy filtered transmission electron microscopy detects electrons at certain energy level, therefore loses the compositional information. As a result, spatial and composition information may not be derived from a single image.

SUMMARY

In one embodiment, a method for imaging a sample comprises irradiating a sample with a charged particle beam; directing scattered particles from the sample to form a first image before entering a spectrometer; dispersing the scattered charged particles based on energies of the scattered charged particles by passing the scattered charged particles through the spectrometer; and forming a second image with the dispersed particles on a detector, wherein the scattered charged particles at each location of the first image is spread along a corresponding energy spread vector in the second image. In this way, the energy loss and the scattering angle of the scattered electrons may be recorded simultaneously in the second image. Further, the spatial and composition information may be resolved and extracted from the second image.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for energy resolved chroma imaging. The energy resolved chroma image records both the energy loss information of the inelastically scattered electrons and the scattering angle information of the elastically scattered electrons. The energy loss information and the scattering angle information may be differentiated and independently extracted from the energy resolved chroma image.

Figure 1:
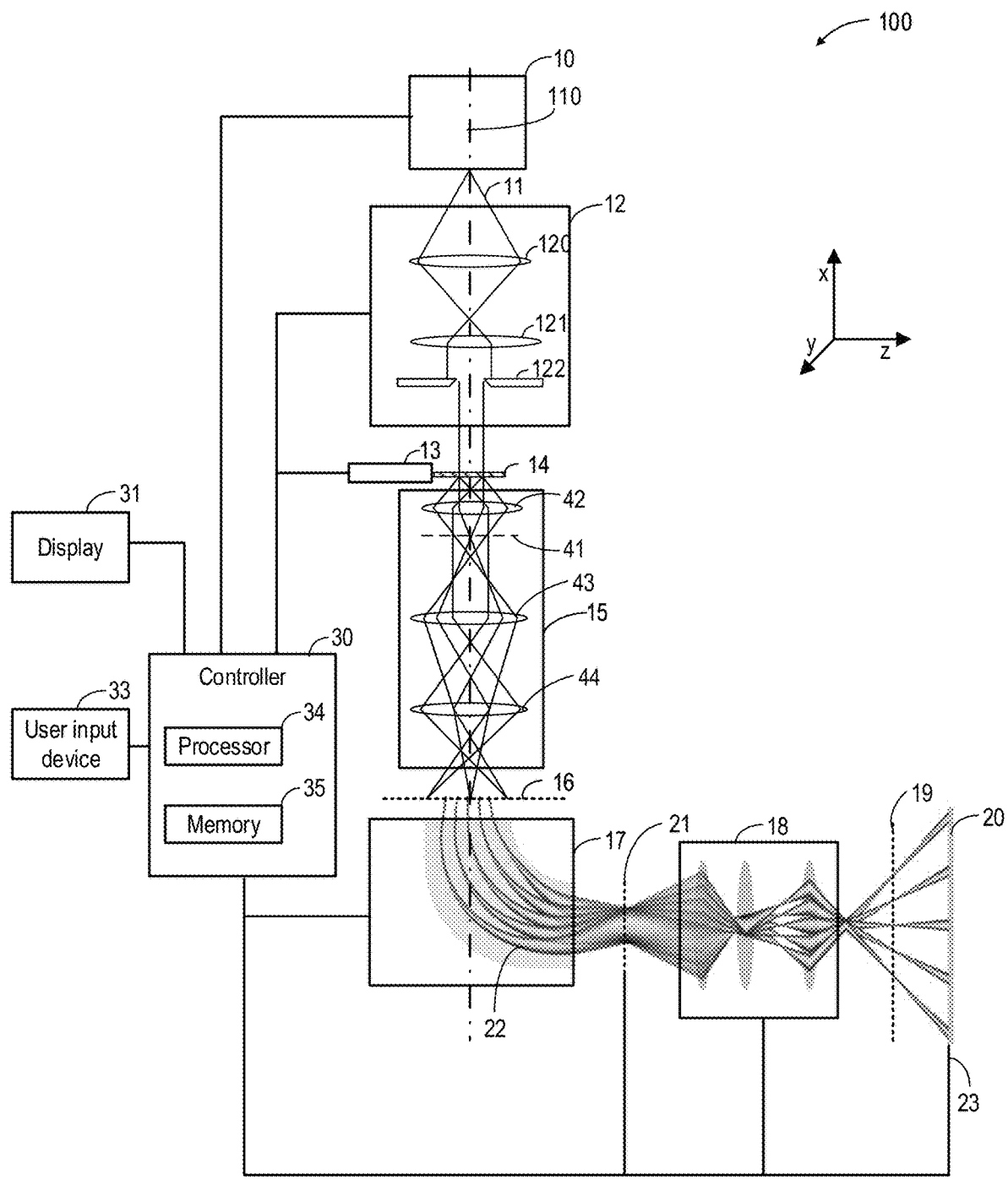
FIG. 1 shows an imaging system for energy resolved chroma imaging, according to some embodiments.
Figure 2:
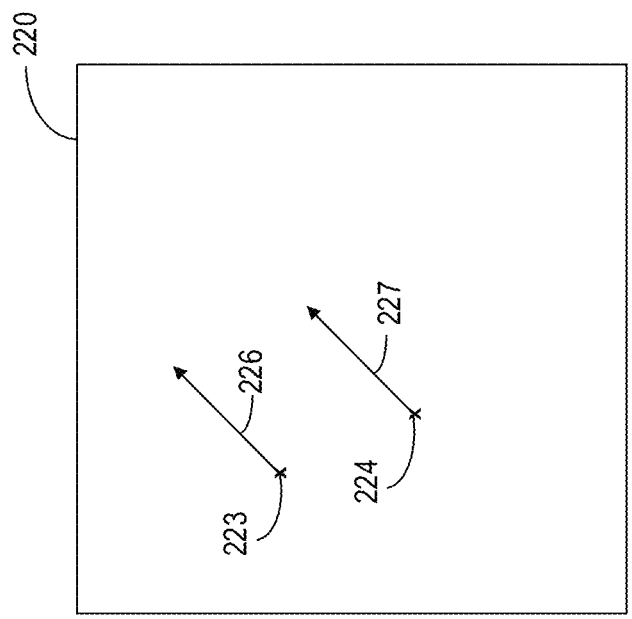
FIG. 2 is a graph illustrating relationship between a first image formed upstream of the spectrometer and a corresponding second image formed on the detector.
Figure 2:
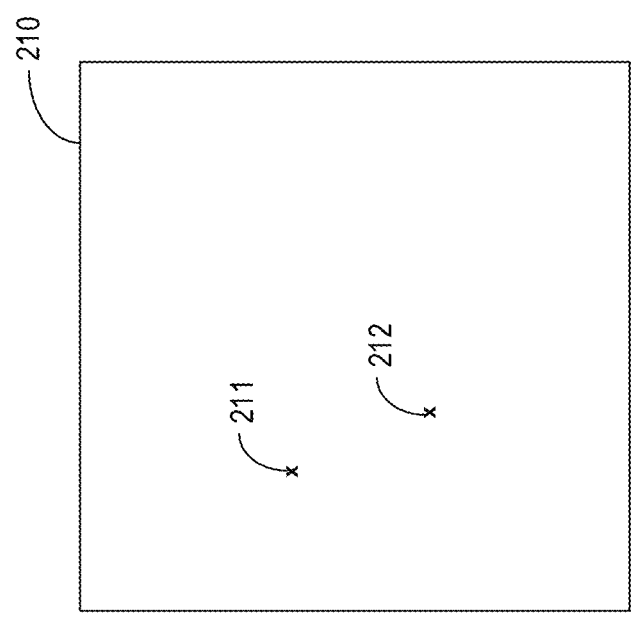

The energy resolved chroma image (ERCI), such as an energy resolved chroma diffraction pattern (ERCDP), may be acquired using a transmission electron microscopy (TEM) system shown in FIG. 1. Upon irradiation with a charged particle beam, scattered charged particles from the sample are directed to form a first image before entering a spectrometer. The scattered charged particles are then dispersed based on the energy loss. The dispersed charged particles form a second image (i.e. the ERCI) on the detector. FIG. 2 shows the relationship between the first image formed upstream of the spectrometer and the ERCI formed on the detector. The scattered charged particles at a location of the first image are spatially spread along an energy spread vector in the ERCI. Particles with higher energy loss are spread further away from the zero-loss particles (i.e. scattered charged particles with no energy loss). The ERCI may include multiple energy spread vectors. The length and direction of the energy spread vector may be tuned by adjusting post-dispersion optics positioned downstream of the spectrometer. For an energy spread vector with zero length, the second image becomes a scaled first image. Herein, "upstream" and "downstream" are defined by the sequence that the scattered charged particles from the sample interact with the optical components.

Figure 3:
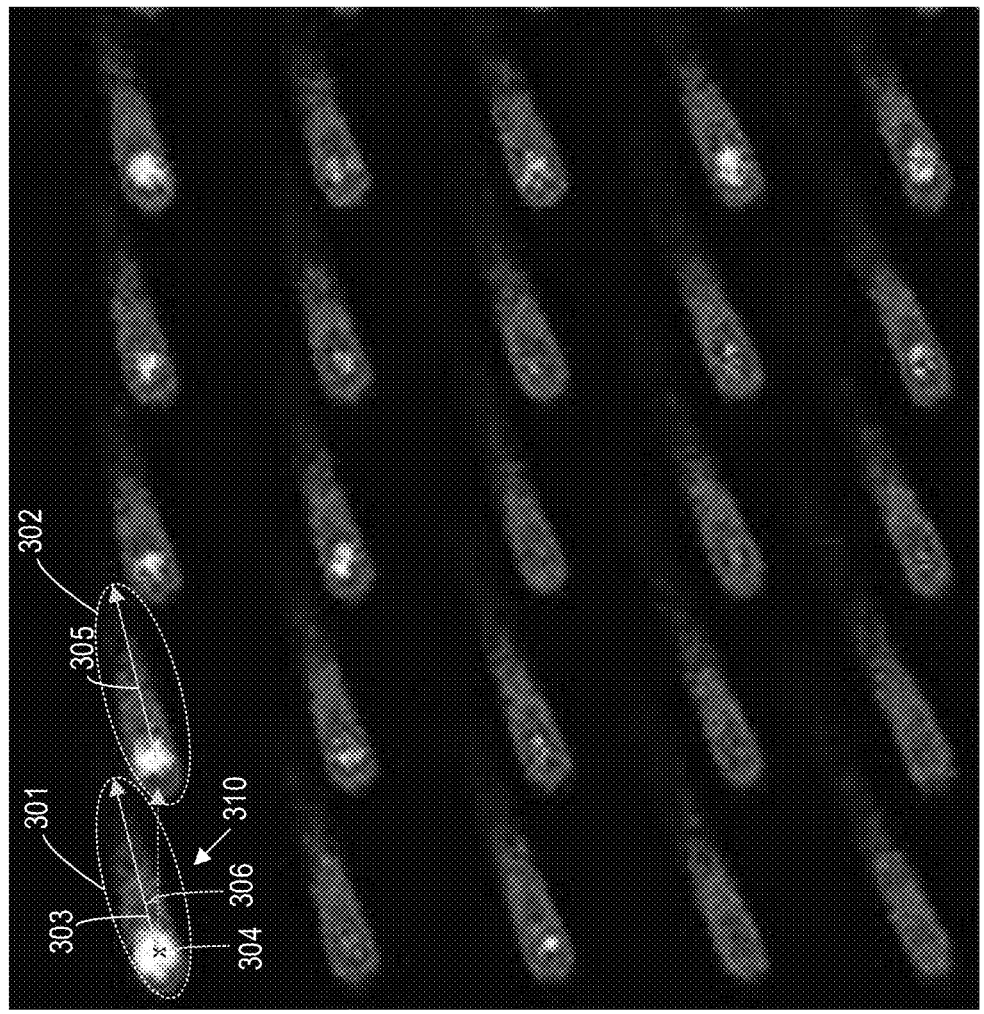
FIG. 3 shows an example energy resolved chroma diffraction pattern.

In one example, the first image formed upstream of the spectrometer is a diffraction pattern of the sample, and the second image is an energy resolved chroma diffraction pattern (ERCDP). In conventional diffraction pattern, high intensity signals may concentrate at sparsely distributed diffraction spots, and most of the pixels of the diffraction pattern are dark with zero signal intensity. In the ERCDP, the dark pixels of the conventional diffraction pattern are utilized for recording the energy loss information. If the energy spread vector's length is zero, the ERCDP becomes a diffraction pattern. FIG. 3 shows an example ERCDP. Each diffraction spot of the diffraction pattern formed upstream of the spectrometer is spatially spread along an energy spread vector, into a corresponding energy spread area, in the ERCDP. The spatial distribution of the origins of the energy spread vectors is determined by the diffraction angle of the charged particles. By tuning the direction and the length of the energy spread vector, the energy loss information in ERCDP may be recorded in the un-utilized zero-intensity pixels of the conventional diffraction pattern. In this way, in ERCDP imaging, the detecting area of the detector is more efficiently used comparing to diffraction imaging. Further, by spreading the high intensity diffraction spots along the energy spread vector, each diffraction spot occupies more pixels in the ERCDP comparing to the conventional diffraction pattern, which may facilitate identifying diffraction spots and avoid detector saturation. In another sample, the first image may be a TEM image. If the high intensity signals in the TEM image are sparse, they may be spread into zero-intensity regions of the image.

Figure 4:
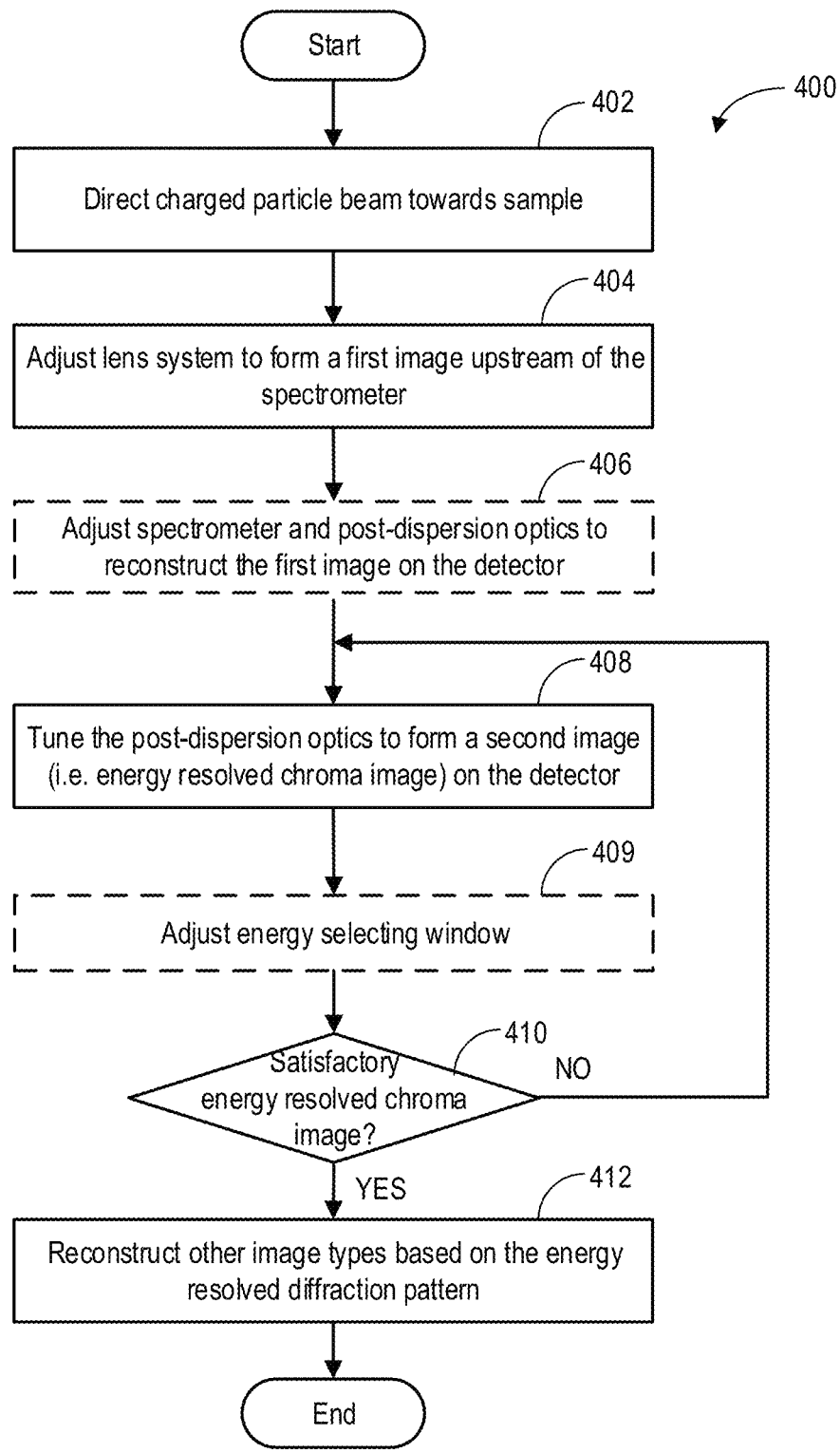
FIG. 4 is an example method for acquiring the energy resolved chroma image.
Figure 5:
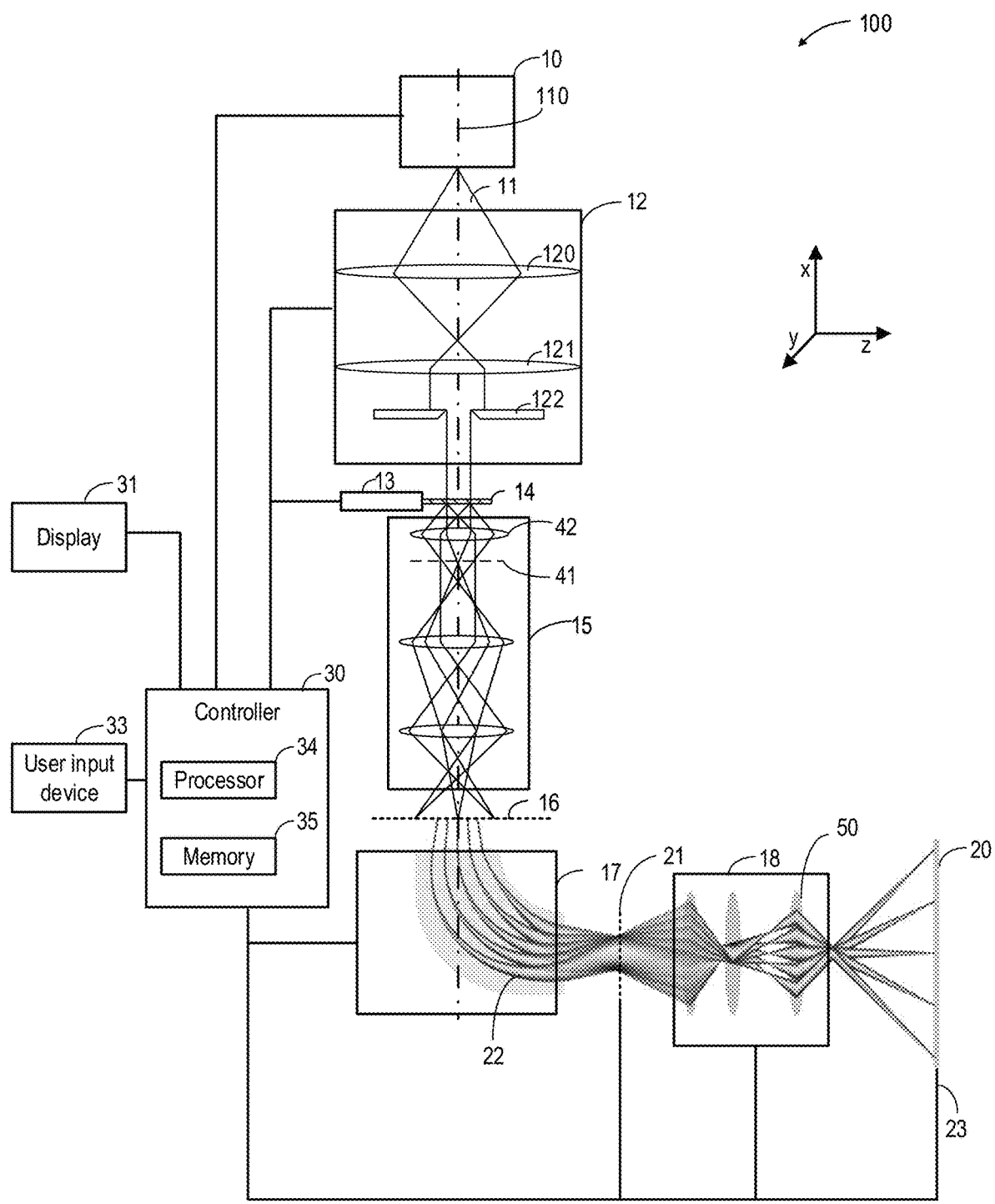
FIG. 5 shows the imaging system of FIG. 1 tuned for diffraction imaging.
Figure 6:
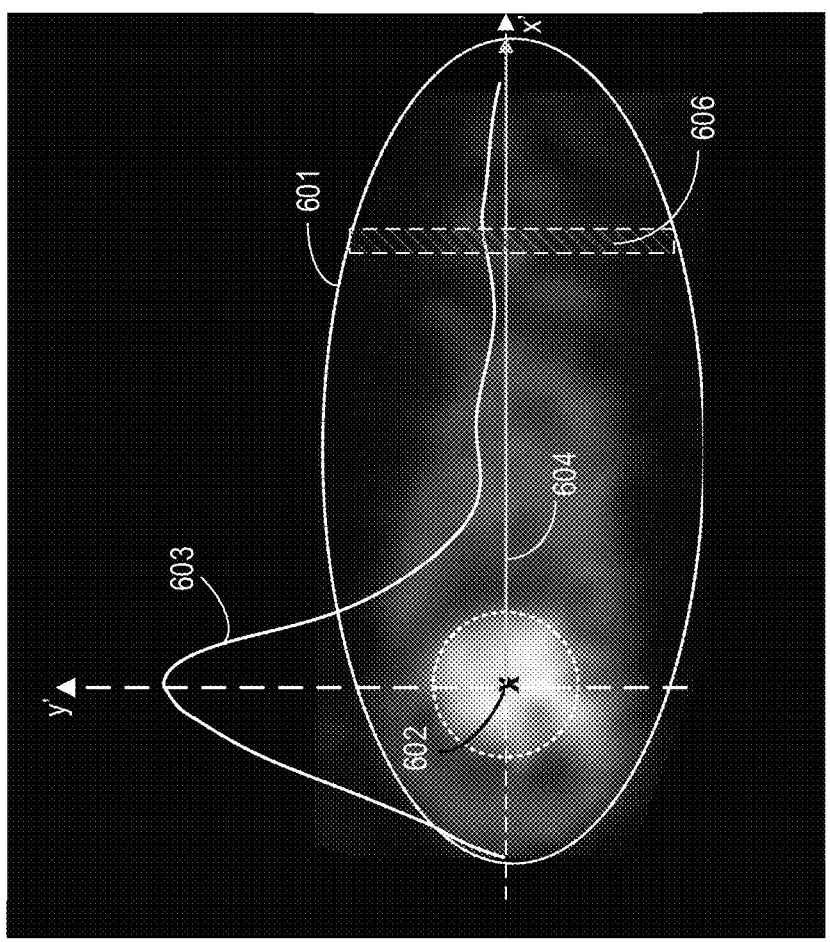
FIG. 6 illustrates calculating the energy loss spectrum of a diffraction spot based on the energy resolved chroma diffraction pattern.

FIG. 4 shows a method for acquiring the ERCI. In one example, the system may be tuned to first form a diffraction pattern on the detector, as shown in FIG. 5. The system may then be tuned based on the diffraction pattern for ERCDP acquisition. The scattering angle and the energy loss information may be extracted from the ERCI. For example, diffraction pattern, electron energy loss spectra, and w-q data may be reconstructed from the ERCDP. FIG. 6 illustrates reconstructing the energy loss spectrum of a diffraction spot from the ERCDP.

Turning to FIG. 1, a TEM system 100 in accordance with an embodiment of the disclosure is shown. The TEM system 100 includes a particle source 10 that emits charged particles along emission axis 110, such as electron beam 11, towards a column 12. The electron source 10 may generate high energy electrons, that is, electrons having typical energies of between about 10 keV and 1,000 keV. In some embodiments, the column 12 may include one or more condenser lenses, such as condenser lenses 120 and 121, and one or more apertures, such as aperture 122. Column 12 collimates electrons generated from electron source 10 and directs the collimated electron beam onto sample 14. The sample 14 may be held by a sample holder 13. The sample holder 13 may adjust sample position by tilting and/or translating the sample.

Scattered electrons transmitted through the sample are directed to a lens system 15. The lens system 15 may include objective lens 42, intermediate lens 43, and projector lens 44. The objective lens 42 may focus the scattered electrons on a back focal plane 41 of the objective lens. The lens system 15 directs the scattered particles to form a diffraction pattern at plane 16, before entering spectrometer 17. Spectrometer 17 disperses the scattered particles into an energy-resolved array of spectral sub-beams 22 based on their diffraction angle and energy loss (or electron energy). The array of spectral sub-beams 22 converges at slit plane 21 before entering post-dispersion optics 18. When the lens system 15 is tuned such to produce a diffraction pattern at plane 16 (as shown in FIG. 1), then the slit plane 21 may be a conjugate plane of the sample plane (i.e. the plane where sample 14 is located). When the lens system 15 is tuned such to produce an image of the sample (such as a TEM image of the sample) at plane 16, then the slit plane 21 may be a conjugate plane to the back focal plane 41. An energy selecting window may optionally be positioned at the slit plane 21. The post-dispersion optics 18 may include one or more lenses to magnify/focus and project the scattered electrons on detector 20. The post-dispersion optics may form a diffraction pattern at imaging plane 19. The imaging plane 19 may be upstream of detector 20 (as shown in FIG. 1), or downstream of detector 20. The detector 20 may be a 2D detector that detects the received electrons and transfers the detected signal to controller 30 to form an image. The detector 20 may include an amplifier for amplifying the detected signal before sending the signal to controller 30. In one example, the detector 20 may be a pixelated detector.

As such, scattered charged particles transmitted through the sample sequentially travel through the lens system 15, the spectrometer 17, and the post-dispersion optics 18 before detected by the detector 20. The lens system 15 is positioned upstream of the spectrometer 17, and the spectrometer 17 is positioned upstream of the post-dispersion optics 18. The diffraction pattern formed at plane 16, upstream of the spectrometer 17 and downstream of the lens system 15, may be a 2D diffraction pattern. In one example, no physical component is positioned between plane 16 and the spectrometer 17. In other words, all scattered particles forming the diffraction pattern at plane 16 pass through the spectrometer 17. The term "upstream" and "downstream" are defined by the sequence that the scattered charged particles from the sample interact with the optical components.

Controller 30 includes processor 34 and non-transitory memory (or computer readable medium) 35. The controller 30 controls the operation of the TEM system 100, either manually in response to operator instructions or automatically by executing the computer readable instructions stored in memory 35. The processor 34 may be configured to execute the computer readable instructions to control various components of the TEM system 100 in order to implement any of the methods described herein. For example, controller 30 may adjust the dose of the electron beam irradiated towards the sample by adjusting the voltage or current supplied to the electron source. The current density may be adjusted by adjusting the condenser optics (such as condenser lens 120 and 121). The controller 30 may adjust the profile of the incident beam by adjusting one or more apertures and/or lens in column 12. The controller 30 may adjust the sample position and/or orientation relative to the incident beam by adjusting the sample holder 13. The controller 30 may adjust the spectrometer 17 and/or the post-dispersion optics 18 to adjust position of imaging plane 19. The controller 30 may adjust the energy selecting window to filter the scattered electrons based on electron energy. The controller 30 may further be coupled to a display 31 to display notifications and/or images of the sample. The controller 30 may receive user inputs from user input device 33. The user input device 33 may include keyboard, mouse, and touchscreen.

In some embodiments, the first image may not be a diffraction pattern. For example, the first image may be a TEM image showing structure of the sample, and the energy resolved chroma image is an energy resolved chroma image of sample structure.

Though the TEM system is described here by way of example, it should be understood that the energy resolved chroma image may be acquired with other microscopy systems. As one example, the energy resolved chroma diffraction pattern may be acquired from an X-ray diffraction system. As another example, the energy resolved chroma image may be acquired from a scanning transmission electron microscopy (STEM) system. In some embodiments, the energy resolved chroma image may be acquired using an optical based microscopy system. The present discussion of TEM system is provided merely as an example of one suitable imaging modality.

FIG. 2 illustrates the relationship between the first image 210 formed at plane 16 upstream of the spectrometer and the second image (i.e. ERCI) 220 detected at detector 20 of FIG. 1. Both the first image 210 and the second image 220 are two-dimensional images. In one example, the first image is the diffraction pattern, and the second image is the ERCDP.

The electrons reaching each location of the first image 210 are spatially spread along a corresponding energy spread vector in the second image 220 based on electron energy (or energy loss). In other words, the spatial distribution of the electrons in the ERCI depend on the energy loss. For example, electrons passing locations 211 and 212 in the first image 210 are spread along the energy spread vectors 226 and 227 in the second image 220, respectively. Without higher order aberrations, the electrons may spread into a line overlapping the energy spread vector. The origins 223 and 224 of the energy spread vectors 226 and 227 correspond to the location of zero-loss scattered electrons. The zero-loss scattered electrons are electrons that have not lost energy when interacting with the sample and have the highest energy among the scattered electrons. Spatial distribution of the origins of the energy spread vectors is determined by the diffraction angles of the scattered electrons. Higher energy loss electrons (with lower electron energy) are spread further away from origins of the energy spread vectors. Without higher order aberrations, the distance of the electrons to the origin of the corresponding energy spread vector is proportional to the amount of energy loss. If there is no distortion, the lengths and directions of all the energy spread vectors in the second image 220 correspond to the same energy loss. The length and direction of the energy spread vector depend on the configuration of the imaging system. The length and direction of the energy spread vector may be independently adjusted by tuning one or more of the spectrometer 17 and the post-dispersion optics 18 of FIG. 1.

In one example, the first image 210 may be a diffraction pattern formed upstream of the spectrometer, and the second image 220 may be the ERCDP. Locations 211 and 212 may represent two diffraction spots. The electrons forming diffraction spots 211 and 212 are spread along corresponding energy spread vectors 226 and 227, respectively. Position of the origins (223 and 224) of the energy spread vectors (226 and 227) in the ERCDP corresponds to location of detected zero-loss electrons. The x-y coordinates of origins 223 and 224 in the ERCDP may be obtained by scaling the x and y coordinates of diffraction spots 211 and 212 in the diffraction pattern with a scaling factor. The scaling factor depends on the configuration of the imaging system. As such, electrons with the same diffraction angle (or belonging to the same diffraction spot) but different energy loss may be differentiated in the ERCDP.

FIG. 3 shows an example ERCDP in greyscale. Brighter signals indicate stronger signal intensity, or a larger number of detected charged particles. The ERCDP is formed by spreading electrons from five-by-five distinct diffraction discs along their respective energy spread vectors. Due to higher order aberrations, the diffraction spots in the diffraction pattern are in the form of discs, rather than points. For example, as shown in 310, electrons forming a diffraction disc in the diffraction pattern are spread in an energy spread area 301 of the ERCDP, along energy spread vector 303. Signal intensity decreases in the direction of the energy spread vector 303. The origin 304 of the energy spread vector 305 corresponds to the center of the diffraction disc in the diffraction pattern. The energy spread area 302 is formed by electrons of an adjacent diffraction disc spread along the energy spread vector 305. The length and the direction of the energy spread vector may be adjusted to minimize the overlap between adjacent energy spread areas (such as energy spread areas 301 and 302), while at the same time utilize more zero signal space (i.e. the dark space).

FIG. 4 shows method 400 for acquiring the ERCI using a microscopy system, such as the TEM system 100 in FIG. 1. Method 400 may be implemented semi-automatically or automatically by executing the computer readable instructions stored in the non-transitory memory of the controller. Method 400 may also include reconstructing other image types, such as energy loss spectroscopy images and/or energy filtered images, based on the ERCI.

At 402, a charged particle beam, such as an electron beam, is directed towards the sample. The charged particle beam may be a parallel beam or a focused beam.

At 404, a lens system (such as lens system 15 of FIG. 1) is adjusted to direct scattered charged particles from the sample to form a first image before passing through the spectrometer. In one example, the first image may be a diffraction pattern. In another example, the first image may be a TEM image. The first image is a virtual image and is not detected by any detector. The scattered charged particles from the first image do not pass any physical components before entering the spectrometer. The scattered charged particles forming the first image are dispersed based on the diffraction angle and the energy of the particles when passing through the spectrometer.

At 406, the spectrometer and the post-dispersion optics are optionally adjusted to reconstruct the first image on the detector. The spectrometer and the post-dispersion optics may be adjusted to form a conjugate plane of the first image at the location of the detector. The reconstructed first image on the detector is free from the first order chromatic aberration, wherein electrons from the same location of the first image is in-focus in the reconstructed first image. In other words, energy loss of the electrons is not recorded in the reconstructed image. The reconstructed first image may be displayed, such as on display 31 of FIG. 1.

In one example, the first image is a diffraction pattern, and the diffraction pattern is reconstructed on the detector. FIG. 5 shows the trajectory of scattered electrons in the TEM system 100 of FIG. 1 when the diffraction pattern at plane 16 is reconstructed on its conjugate plane on detector 20. That is, imaging plane 19 overlaps with the detector 20. Each diffraction spot in the diffraction pattern reconstructed on detector 20 is formed by electrons of various energy loss but substantially the same diffraction angle. In one example, the reconstructed diffraction pattern may be acquired at a lower beam dose comparing to the dose of the later acquired ERCDP at 408 to reduce radiation damage of the sample.

At 408, one or more lenses of the post-dispersion optics may be tuned to form the ERCI on the detector. In one example, the distance between the post-dispersion optics and the detector is not changed during the tuning process. By tuning the post-dispersion optics, scattered electrons are spread along the corresponding energy spread vectors based on their energy loss. In one example, only one lens (such as lens 50 of FIG. 5) in the post-dispersion optics may be adjusted to translate the reconstructed first image (imaging plane 19 of FIG. 1) to a position different from the detector. The imaging plane 19 is parallel to detector 20, as shown in FIG. 1. As such, scattered electrons with different energy loss have the same degree of defocus on the detector and in the ERCI. In another example, more than one lens in the post-dispersion optics may be adjusted so that scattered electrons with different energy loss are focused differently on the detector and in the ERCI. For example, the zero-loss electrons may be in-focus on the detector, while electrons with higher energy loss are spread further away from the zero-loss electrons on the detector.

The one or more lenses of the post-dispersion optics may be tuned based on the reconstructed first image acquired at 406. In one example, an energy spread vector may be determined based on the reconstructed first image, and the system may be tuned to obtain the ERCI corresponding to the energy spread vector. The length and the direction of the energy spread vector may be determined based on the reconstructed first image to maximize the length of the energy spread vector and at the same time minimize the overlap between the energy spread areas. For example, in FIG. 3, instead of having the energy spread vector pointing along the x-axis, the energy spread vector 303 is tilted to have an angle 306 from the x-axis. As such, the size of the energy spread areas 301 and 302 may be increased without overlapping with each other. The length of the energy spread vector may be adjusted by tuning/adjusting post-disperse optics.

Other parameters of the microscopy system may be adjusted while tuning the post-dispersion optics. For example, the dose of the charged particle beam may be increased with increased length of the energy spread vector.

In some embodiments, the post-dispersion optics may be tuned continuously while monitoring the ERCI detected by the detector.

At 409, the energy selecting window positioned at the slit plane between the spectrometer and the post-dispersion optics may optionally be adjusted to selectively filter the scattered electrons based on the energy loss. For example, the energy selecting window maybe inserted in the slit plane to block at least some zero-loss or low-loss electrons. As such, detector saturation by high intensity signals may be avoided. In another example, electrons of certain range of energy loss may be blocked by the energy selecting window to reduce the length of the energy spread vector and avoid overlaps between energy spread areas. Further, energy loss resolution in the ERCI may be increased.

In some embodiments, the energy selecting window may be adjusted together with the post-dispersion optics.

At 410, the ERCI is evaluated to determine whether the image is satisfactory. If the ERCI is satisfactory, other types of image may be reconstructed based on the ERCI. Otherwise, the post-dispersion optics and/or the energy selecting window is further adjusted until the satisfactory ERCI is obtained.

As one example, the ERCI may be evaluated based on the degree of overlap among the energy spread areas. If the degree of overlap is larger than a threshold overlap, the microscope may be further tuned to decrease the overlap. For example, the length of the energy spread vector may be reduced or the direction of the energy spread vector may be changed. As another example, the ERCI may be evaluated based on the number of pixels with signal amplitude lower than a threshold level. If the number of low signal pixels is greater than a threshold number, the microscope may be tuned to increase the size of the energy spread area. For example, the length of the energy spread vector may be increased.

At 412, different types of images may be reconstructed based on the ERCI. If the ERCI is an ERCDP, the ERCI includes both the scattering angle information and the energy loss information. Therefore, images including the diffraction pattern, energy loss spectrum, energy filtered image, and w-q plot, may be reconstructed from the ERCDP. In some examples, if the ERCI is a TEM image, the spatial intensity information and the energy loss information are recorded in the ERCI. The spatial intensity information and the energy loss information can be extracted from a single ERCI.

As one example, diffraction pattern may be reconstructed from the ERCDP by integrating the signal amplitude within each energy spread area. For example, the intensity of the reconstructed diffraction spot in the diffraction pattern may be calculated by integrating the signal strength within the corresponding energy spread area. The location of the reconstructed diffraction spot may be the location of the highest intensity in the respective energy spread area (i.e. location of the zero-loss electrons). Since each diffraction spot is spread in an energy spread area in the ERCDP, comparing to directly acquiring the diffraction pattern with the detector, detector saturation may be avoided. Further, diffraction spots may be easily identified in the ERCDP.

As another example, the energy loss spectrum may be reconstructed by generating an energy loss spectrum for each energy spread area, and then summing up the spectra of all energy spread areas. For example, the energy loss spectrum may be the sum of the electron loss spectra of all diffraction spots in the ERCDP.

The energy loss spectrum for an energy spread area may be calculated by integrating the signal in a direction orthogonal to the energy spread vector. FIG. 6 shows an example electron energy loss spectrum 603 of a diffraction spot extracted from an energy spread area 601 of the ERCDP. Energy spread vector 604 originates from 602. The x' axis represents distance along an axis aligned with energy spread vector 604. Due to the spatial energy spread, the x' axis also represents the energy loss. The energy loss increases as indicated by the arrow of the x' axis. The y' axis represents the number of electrons, and the electron number increases as indicated by the arrow of the y' axis. The energy loss spectrum 603 at a particular x'-axis position may be calculated by integrating the pixel values of the chroma diffraction pattern within the energy spread area 601 in a direction orthogonal to the energy spread vector 604.

As yet another example, an energy filtered image may be reconstructed from the ERCI by removing detected signals corresponding to one or more energy bands. Signals corresponding to a particular energy band may be removed by setting signals corresponds to the energy band to zero. For example, in FIG. 6, by setting the pixels within area 606 to zero, detected electrons with the energy band corresponding to x1-x2 in the x' axis are removed from the energy spread area 601. Energy filtered diffraction pattern or energy filtered TEM image may be reconstructed based on the energy filtered ERCDP.

In yet another example, a ω-q plot of vibrational losses (ω) versus momentum transfer (q) may be reconstructed from the ERCDP. The vibrational losses may be extracted from the energy distribution of the scattered charged particles spread along the energy spread vectors. The momentum transfer (or the scattering angles) may be extracted from the spatial distribution of the origins of the energy spread vectors. In this way, a ω-q plot may be reconstructed based on a single ERCDP. The data acquisition time for the ω-q plot may be significantly reduced.

In this way, the ERCI records both the charged particle scattering angle information and the energy loss information. The scattering angle and the energy loss information may be decoupled to reconstruct sample structure as well as sample composition. The energy resolved chroma image may be acquired with minimal hardware adjustment to an existing imaging system.

The technical effect of dispersing scattered particles based on the energy loss is that signals at a location of the image formed upstream of the spectrometer entrance may spread along an energy spread vector of the ERCI. The technical effect of spreading particles within an energy spread area is to avoid detector saturation and facilitate identifying the diffraction spot. The technical effect of tuning the system to reconstruct the image formed upstream of the spectrometer on the detector before acquiring the ERCI is to obtain the ERCI with minimal system adjustment. Further, the system may be tuned for ERCI acquisition based on the reconstructed image, and the system tuning time may be reduced.

What is claimed is:

1. A method for imaging a sample, comprising:
   irradiating a sample with a charged particle beam;
   directing scattered charged particles from the sample to form a first image before entering a spectrometer;
   dispersing the scattered charged particles based on energies of the scattered charged particles by passing the scattered charged particles through the spectrometer; and
   forming a second image with the dispersed particles on a detector, wherein the scattered charged particles at each location of the first image is spread along a corresponding energy spread vector in the second image.

2. The method of claim 1, wherein the scattered charged particles with higher energy loss are spread further away from the scattered charged particles with lower energy loss along the energy spread vector in the second image.

3. The method of claim 1, wherein the first image is a diffraction pattern of the sample.

4. The method of claim 1, wherein a distance of the spread particles to an origin of the corresponding energy spread vector is proportional to an amount of energy loss of the spread particles.

5. The method of claim 1, wherein all scattered charged particles forming the first image are dispersed by the spectrometer.

6. The method of claim 1, further comprising passing the dispersed particles through post-dispersion optics before forming the second image on the detector.

7. The method of claim 6, further comprising adjusting a direction of the energy spread vector by adjusting the post-dispersion optics.

8. The method of claim 1, wherein there is no physical component positioned between the first image and the spectrometer.

9. The method of claim 1, wherein the charged particle beam is an electron beam.

10. A method for imaging a sample, comprising:
    irradiating a sample with a charged particle beam;
    directing scattered charged particles from the sample to form a diffraction pattern before entering a spectrometer;
    passing the scattered charged particles through the spectrometer;
    detecting the scattered charged particles passed the spectrometer with a detector; and
    forming an energy resolved chroma image with the detected particles, wherein each diffraction spot in the diffraction pattern is spread along a corresponding energy spread vector in the energy resolved chroma image.

11. The method of claim 10, further comprising reconstructing a second diffraction image of the sample based on the energy resolved chroma image.

12. The method of claim 10, further comprising reconstructing a plot of vibrational losses versus momentum transfer based on the energy resolved chroma image.

13. The method of claim 10, further comprising energy filtering the scattered particles passed the spectrometer, and wherein detecting the scattered charged particles includes detecting the energy filtered scattered charged particles.

14. The method of claim 10, wherein an origin of the energy spread vector in the energy resolved chroma diffraction pattern corresponds to a location of corresponding zero-loss scattered charged particles.

15. An imaging system, comprising:
    a source for generating a charged particle beam;
    a spectrometer for dispersing charged particles based on energies of the charged particles;
    a detector; and
    a controller with a processor and computer readable instructions stored on a non-transitory memory, the controller is configured to:
    irradiate a sample with the charged particle beam;
    direct scattered charged particles from the sample to form a first image before entering the spectrometer;
    passing the scattered charged particles through the spectrometer; and
    form a second image with the dispersed particles on the detector, wherein the scattered charged particles at each location of the first image is spread along a corresponding energy spread vector in the second image.

16. The imaging system of claim 15, further comprising post-dispersion optics positioned between the spectrometer and the detector, and wherein the controller is further configured to adjust a spatial distribution of the dispersed particles in the second image by adjusting the post-dispersion optics.

17. The imaging system of claim 16, wherein the controller is further configured to:
    reconstruct the first image on the detector before forming the second image on the detector; and form the second image on the detector by adjusting the post-dispersion optics based on the first image.

18. The imaging system of claim 17, wherein a distance between the spectrometer and the detector is not changed from reconstructing the first image on the detector to forming the second image on the detector.

19. The imaging system of claim 16, further comprising an energy selecting window positioned between the spectrometer and the post-dispersion optics, and wherein the controller is further configured to adjust the energy selecting window to reduce an intensity of low energy loss dispersed particles received by the detector.

* * * * *